(12) United States Patent
Chien

(10) Patent No.: US 6,171,117 B1
(45) Date of Patent: Jan. 9, 2001

(54) CONNECTOR ARRANGEMENT FOR AN ELECTRO-LUMINESCENT LIGHTING ELEMENT AND NIGHT LIGHT USING SUCH AN ARRANGEMENT

(76) Inventor: Tseng-Lu Chien, 8F, No. 29, Alley 73, Lin-Shen Road, Shi-Chi Town, Taipei, Hseng (TW)

(*) Notice: Under 35 U.S.C. 154(b), the term of this patent shall be extended for 0 days.

(21) Appl. No.: 08/910,202

(22) Filed: Aug. 13, 1997

Related U.S. Application Data

(63) Continuation-in-part of application No. 08/383,404, filed on Feb. 3, 1995, now Pat. No. 5,667,394.

(51) Int. Cl.[7] ........................................................ F21V 9/16
(52) U.S. Cl. ................................................ 439/86; 362/84
(58) Field of Search .............................. 439/86; 362/84, 362/95

(56) References Cited

U.S. PATENT DOCUMENTS

| | | | |
|---|---|---|---|
| 5,358,412 | * 10/1994 | Maurinus et al. | 439/66 |
| 5,469,342 | 11/1995 | Chien | 362/84 |
| 5,572,817 | 11/1996 | Chien | 40/544 |
| 5,662,408 | 9/1997 | Marischen | 362/84 |

* cited by examiner

*Primary Examiner*—Neil Abrams

(57) ABSTRACT

A night light includes an electro-luminescent element (14) connected to an electrical plug by conductive elements (23) in the form of flexible or elastic conductive rubber elements, or conductive elements of similarly flexible and conductive plastic or metal material, compressed between contact areas (16) or the electrodes of the electro-luminescent element and prongs (19) of the electrical plug.

11 Claims, 5 Drawing Sheets

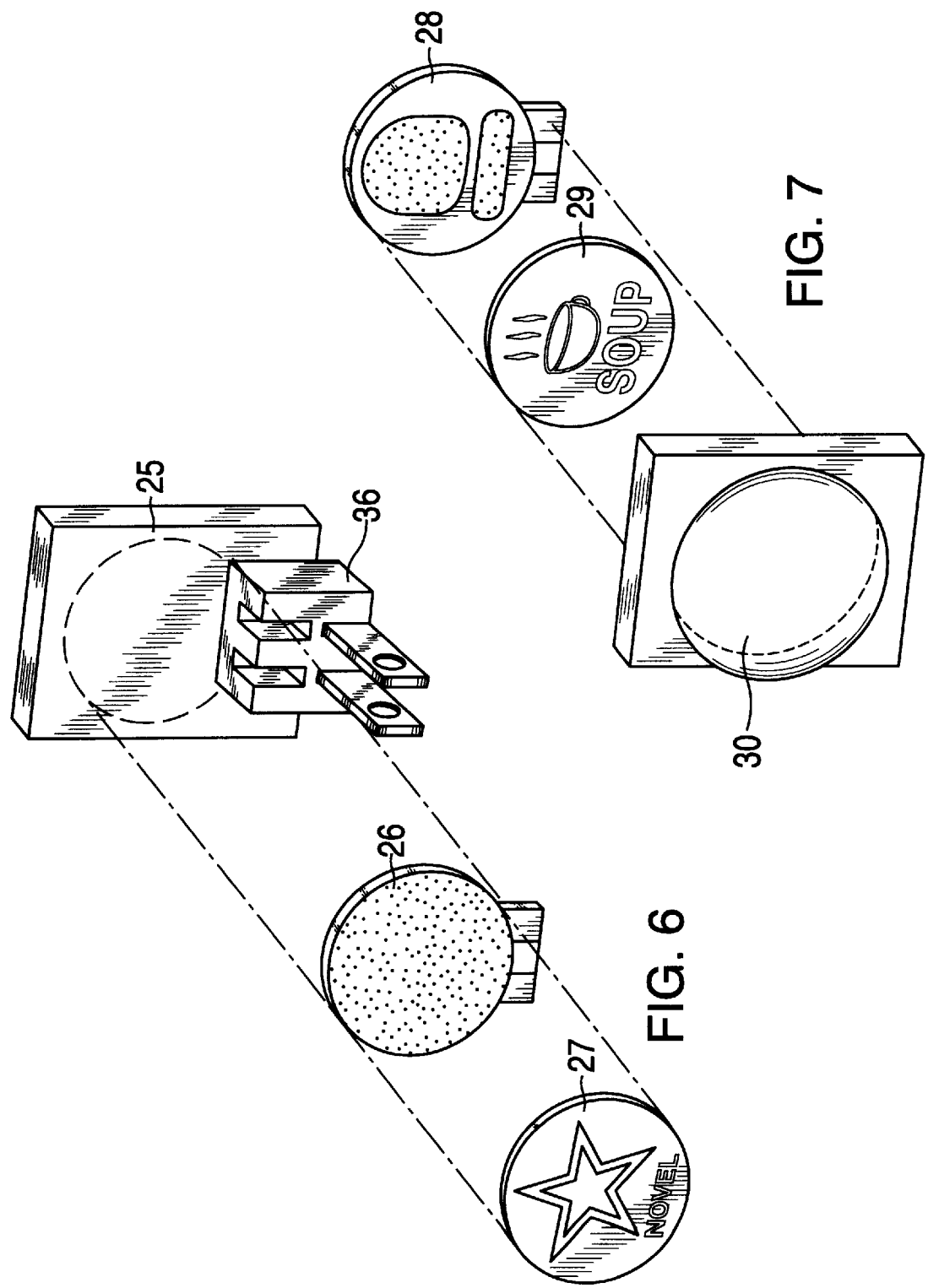

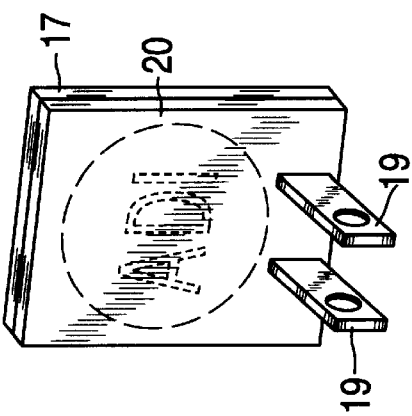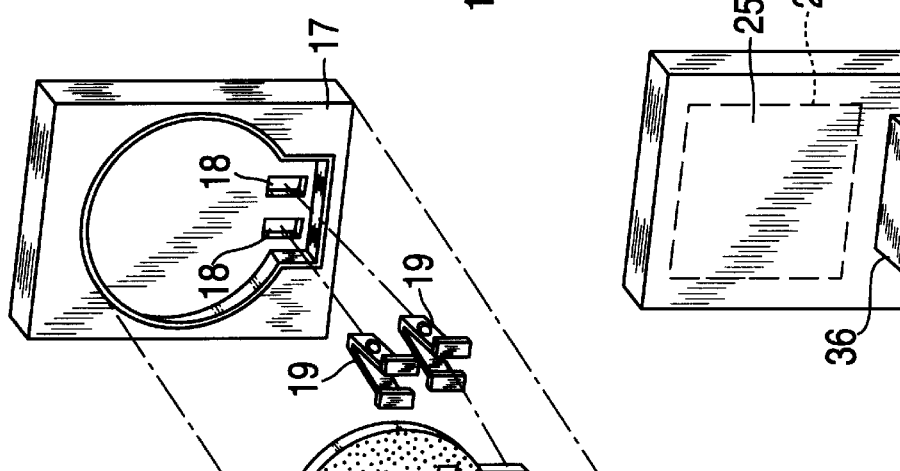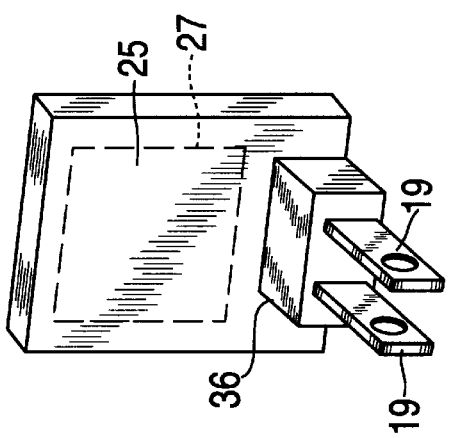

CONNECTOR ARRANGEMENT FOR AN ELECTRO-LUMINESCENT LIGHTING ELEMENT AND NIGHT LIGHT USING SUCH AN ARRANGEMENT

This application is a continuation-in-part of allowed U.S. patent application Ser. No. 08/383,404, filed Feb. 3, 1995, now U.S. Pat. No. 5,667,394.

BACKGROUND OF THE INVENTION

1. Field of the Invention

This invention relates to a connector arrangement for an EL lighting element, in which large area electrodes on the EL lighting element directly engage a specially designed connection member to facilitate electrical connection of the lighting element to the metal plug, thereby eliminating the need for conventional claw type or glue-type terminal arrangements, thereby simplifying assembly of the lighting element while reducing the risk of short circuits, electric shock, and sparking which could present a fire hazard. The invention also relates to an electro-luminescent lighting element for use in such a connector arrangement, and to a night light in which the connector arrangement is used.

2. Discussion of Related Art

The present invention utilizes the connector principles disclosed in parent application Ser. No. 08/383,404 now U.S. Pat. No. 5,667,394, but explicitly extends the concept to a variety of different types of electro-luminescent lighting element. Examples of EL lighting elements which may be used with the connector arrangement disclosed in the parent application and also disclosed herein are the electro-luminescent panels disclosed in U.S. Pat. No. 5,572,817, and in copending U.S. patent application Ser. Nos. 08/729,408 (now U.S. Pat. No. 5,752,337), 08/734,872 (now U.S. Pat. No. 5,883,508), and 08/746,706 (now U.S. Pat. No. 5,734,366), each of which is incorporated by reference herein, as well as the three-dimensional electro-luminescent tube arrangement disclosed in U.S. patent application Ser. No. 08/758,393 (pending), which is also incorporated by reference herein. The connector arrangement disclosed herein may also be used with the optical device disclosed in U.S. patent application Ser. No. 08/841,624 (pending), also incorporated herein by reference, which is a continuation of U.S. patent application Ser. No. 08/489,160 (abandoned).

The description of the invention contained herein is the same as that of the parent application, except that it is clarified that the connector can be used with a number of different lighting elements, that the lighting element itself is not limited to the particular "wire" and conductive member illustrated in the description of the preferred embodiment of the invention, and in that a detailed description of a night light utilizing the principles of the invention has been added.

Basically, the invention simplifies assembly of the connector by utilizing non-penetrative contact between wide area electrodes on the electro-luminescent element and a resilient conductive member. FIGS. 4, 5A, and 5B of parent U.S. patent application Ser. No. 08/383,404, now U.S. Pat. No. 5,676,394 show one example of a connector utilizing these principles, and FIGS. 1B–1D, 3A, and 3B of the parent application give one example of an electro-luminescent element, referred to in the parent application as an EL strip, which may be used in the connector utilizing the principles of the invention. However, while the lighting element shown in FIGS. 1B–1D, 3A, and 3B of the parent application is especially suitable for use with the connector of FIGS. 4, 5A, and 5B of the parent application, as well as the arrangement illustrated in the present application, it will be appreciated by those skilled in the art that any electro-luminescent lighting element with appropriately configured electrodes, including those described in the above cited U.S. Pat. Nos. 5,752,337, 5,883,508, and 5,794,336 and application Ser. No. 08/758,393.

The problems with prior electro-luminescent elements per se is described in detail in the parent application, and need not be repeated herein. Instead, the following discussion relates to the particular application of a night light, which particular benefits from the principles disclosed in the parent application.

In particular, as shown in FIGS. 1 and 2, the conventional means for electrically connecting an electro-luminescent element 1 to a plug is use claw-type metal terminals 2, the teeth 3 of which are designed to penetrate the surface of electrodes or contacts on the electro-luminescent element. In the case of a night light, extensions 4 of these terminals are then connected to the prongs 5 extending through the housing 6 of a plug assembly arranged to be inserted into a wall outlet.

FIG. 3 shows an arrangement similar to that shown in FIGS. 1 and 2, with claw type terminals 7 extending from an electro-luminescent panel 8 attached to prongs 9 secured to the panel by double-sided tape 10 for use in a housing having a rear section 11, and a front section 12 having a window 13 through which the electro-luminescent panel 8 is visible to form the night light.

The problem with the use of claw type terminals, which are designed to push through the multiple layers of the electro-luminescent panel, is that the teeth on the terminals can easily cause damage to the panels during assembly, resulting in a high percentage of defective assemblies, and presenting a serious hazard of electrical shock. This is especially significant in the case of night lights, which are often placed in places where young children may have access to them.

This problem is solved in the parent application by establishing the electrical connection using a resilient conductive member to provide a self-biasing connection between connection wires and the large area terminals on the electro-luminescent element illustrated in the parent application. However, the concept of using a resilient or self-biased arrangement is not limited to the particular conductive member and wire arrangement described in the parent application, but rather can be applied in a wide variety of contexts to a wide variety of different types of electro-luminescent element, and in the case of a night light greatly reduces the above-noted safety problem presented by claw type terminals, while actually simplifying assembly because the force necessary to cause penetration is not required.

SUMMARY OF THE INVENTION

It is accordingly an objective of the invention to provide an electro-luminescent element connector arrangement having simplified assembly and increased reliability, and which presents a reduced risk of sparking and causing a fire.

It is a further objective of the invention to provide and electro-luminescent element connector arrangement having a reduced risk of short circuits and electric shock.

It is also an objective of the invention to provide a night light utilizing an electro-luminescent element connector arrangement having simplified assembly, increased reliability, and a reduced risk of short circuits and electric shock.

These objectives of the invention are achieved, in accordance with the principles of a preferred embodiment of the invention, by providing an electro-luminescent element connector arrangement in which an electrical connection between electrodes on the electro-luminescent element and a source of electric power are provided by resilient conductive elements which provide a self-biased electrical connection to the electrodes without the need for penetrative elements or movable elements.

In the case of a night light, the objectives of the invention are achieved by providing an arrangement in which an electro-luminescent element used in the night light is connected to prongs extending from a housing of the night light by resilient conductive members compressed between contact areas on the prongs and electrodes on the electro-luminescent element or between contact areas of a circuit board containing driver circuitry and the electrodes on the electro-luminescent element.

BRIEF DESCRIPTION OF THE DRAWINGS

FIG. 6 is an exploded perspective view of a variation of the night light of FIG. 5.

FIG. 7 is an exploded perspective view of an electro-luminescent light assembly suitable for use in the night lights of FIGS. 5 and 6.

FIG. 8 is an exploded perspective view of a further variation of the night lights illustrated in FIGS. 5 and 6.

FIG. 9 is a perspective view of an assembled night light corresponding to the night lights illustrated in FIGS. 5 and 8.

FIG. 10 is a perspective view of an assembled night light corresponding to the night light of FIG. 6.

DETAILED DESCRIPTION OF THE PREFERRED EMBODIMENTS

Figure 5:
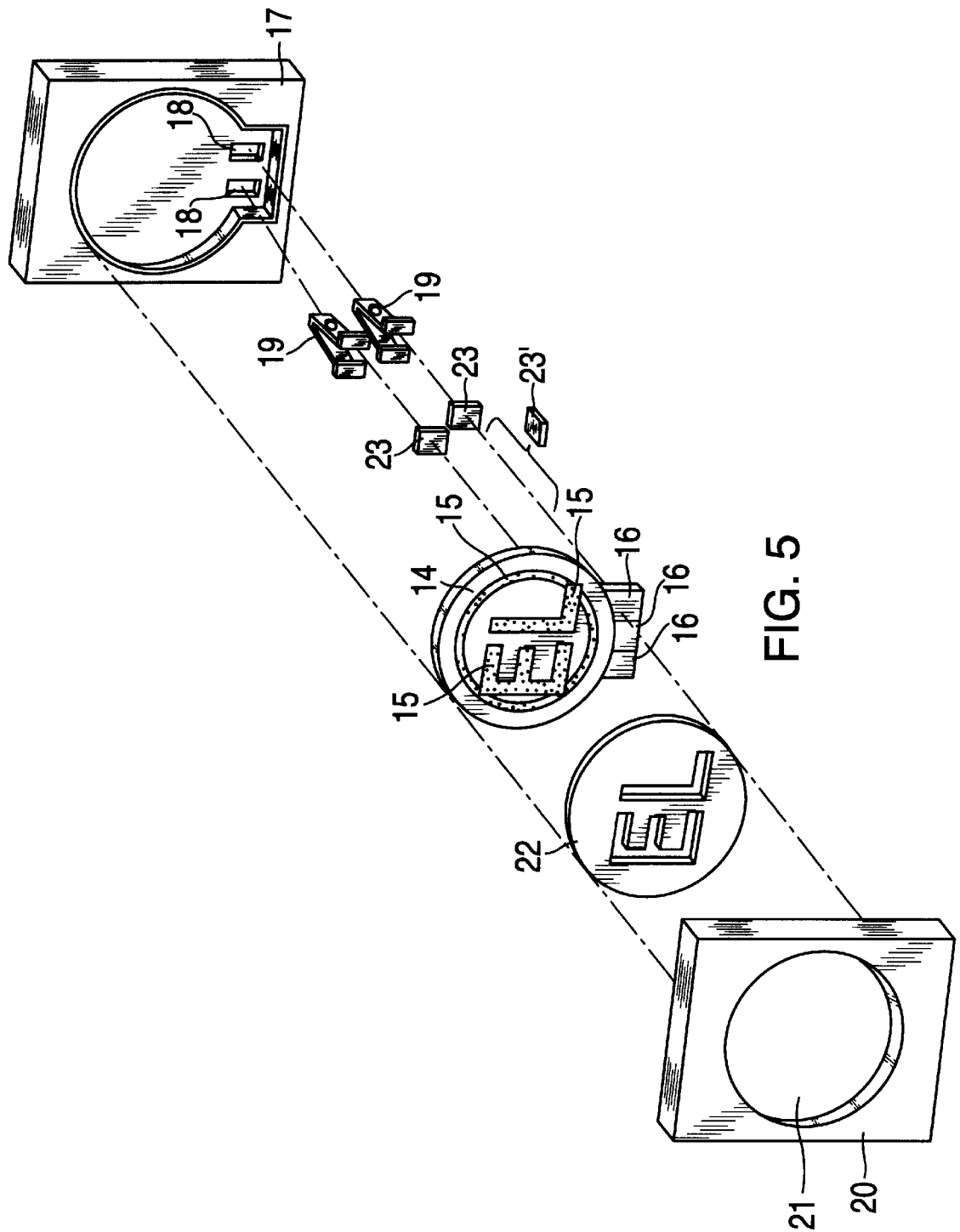
FIG. 5 is an exploded perspective view of a night light constructed in accordance with the principles of a preferred embodiment of the invention.

As illustrated in FIG. 5, a night light constructed in accordance with the principles of a preferred embodiment of the invention includes an electro-luminescent element 14, including multiple phosphor segments 15 and electrode contact areas 16 (which are actually on the rear side of elements 16 extending from panel 14). The housing for the night light includes a rear section 17 containing an indentation for receiving the electro-luminescent element 14 and openings 18 for prongs 19, and a front section 20 having an opening or window 21 through which the electro-luminescent element is to be viewed. An optional frontsheet 22 may be positioned between the electro-luminescent element 14 and window 21.

In order to greatly simplify assembly of the night light of FIG. 5, contact areas 16 and prongs 19 are electrically connected together by means of resilient conductive elements 23 which are compressed between the contact areas and prongs when the housing is assembled together. Compression of the conductive elements 23 ensures that electrical continuity between the electrodes of the electro-luminescent element and the prongs is maintained, with the resilience of the conductive elements also compensating for tolerances in the construction of the prongs or contact areas of the electrodes of the electro-luminescent element, for example in the case where the prongs and electrodes have facing surfaces that are not completely parallel, or not completely flat.

The conductive elements 23 may be in the form of flexible or elastic conductive rubber elements, or conductive elements of similarly flexible and conductive plastic or metal material. Prongs 19 are UL-listed standard plugs, or equivalent plugs arranged to meet the requirements of countries other than the United States.

Preferably, rear housing section 17 and front housing section 20 are sealed together to prevent the night light from being opened and the electrical connections exposed. The indentation in which the electro-luminescent element is received may of course have any desired configuration, or may be eliminated in favor of alternative electro-luminescent element holding means, and the means by which the housing sections are held together and/or sealed may include any suitable holding or sealing means, including glue, double-sided tape, press-fit posts, screws, melting, ultra-sonic sealing, hot melt adhesives, etc., resulting in an attractive and compact night light assembly similar to the one illustrated in FIG. 9.

The electro-luminescent panel 14 may be of the type disclosed in U.S. Pat. No. 5,572,817 U.S. Pat. Nos. 5,752, 337, 5,883,508, and 5,794,336, in which attractive designs are obtained by including logos, figures, cartoon characters, words, on either the frontsheet 22 or the electro-luminescent element itself, either by printing, silk-screening, stencilling, or the like, and/or by appropriately arranging the phosphor segments of the electro-luminescent element. Alternatively, or in addition to electro-luminescent panel 14 the night light may include a three-dimensional tube 14' arranged in an attractive pattern in the manner described in copending U.S. patent application Ser. No. 08/758,393. In the embodiment illustrated in FIG. 8, for example, a single color panel 14" provides background for the illumination effect provided by the three-dimensional electro-luminescent element 14', the other elements of the night light being the same as described in connection with FIG. 5, except that additional conductive resilient elements, for example having the configuration illustrated in parent U.S. patent application Ser. No. 08/383, 404 (now U.S. Pat. No. 5,677,394), must be included in order to provide the necessary electrical connections. Further details of either the electro-luminescent panel or three-dimensional electro-luminescent element may be found in the above-cited patent and patent applications.

While in the arrangement of FIG. 5, the electro-luminescent panel is directly connected to the prongs of the night light outlet, it is also within the scope of the invention to use conductive member(s) 23' to connect one or more electrodes of the panel to an inverter, control circuit, function interface, or the like, which can be in the form of a conventional circuit or an integrated circuit. Numerous suitable circuits are known and it is intended that the invention encompass any circuitry to which the electro-luminescent element might be connected, or no circuitry at all, with the electrodes of the electro-luminescent element being directly and exclusively connected to the prongs of the night light. By circuitry is meant any electrical component, including wires, resistors, capacitors, transistors, inductors, and so forth, as well as switches such as the illustrated photo-sensor 27.

As shown in FIGS. 6 and 10, for example, the additional circuitry might be housed in an extension 26 of the rear housing member 25. FIG. 6 also illustrates the variation in which the electro-luminescent element 26 does not have multiple segments, the decorative pattern being obtained instead by appropriate decoration of the frontsheet 27.

Alternatively, in the variation shown in FIG. 7, the effects obtained by electro-luminescent element 28 and frontsheet 29 are enhanced by including an optical effects device 30 similar to the one described in copending U.S. patent application Ser. No. 08/841,624 and its parent U.S. patent application Ser. No. 08/489,160 (abandoned), in which the image of the electro-luminescent element is enhanced by passage through a transparent transmission medium such as water, a gel, a solid transparent medium, epoxy, silicone, PVC, PC, acrylic, or the like to increase the apparent brightness of the element. The optical device can form a convex or concave lens, and can magnify the image, change the image location, change the focus, or change the color of emitted light in a simple and inexpensive yet effective manner.

Figure 1:
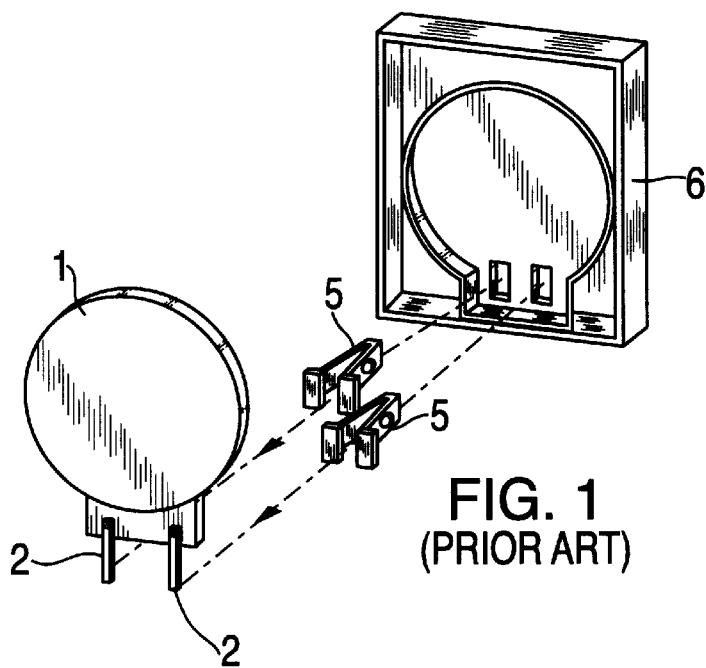
FIG. 1 is an exploded perspective view of a night light having a conventional construction.
Figure 2:
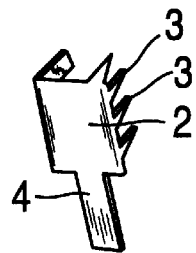
FIG. 2 is a perspective view of a claw-type terminal for use in the night light of FIG. 1.
Figure 3:
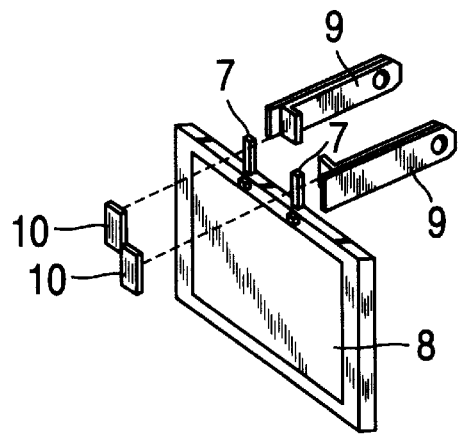
FIG. 3 is a perspective view of a portion of a variation of the night light of FIG. 1.
Figure 4:
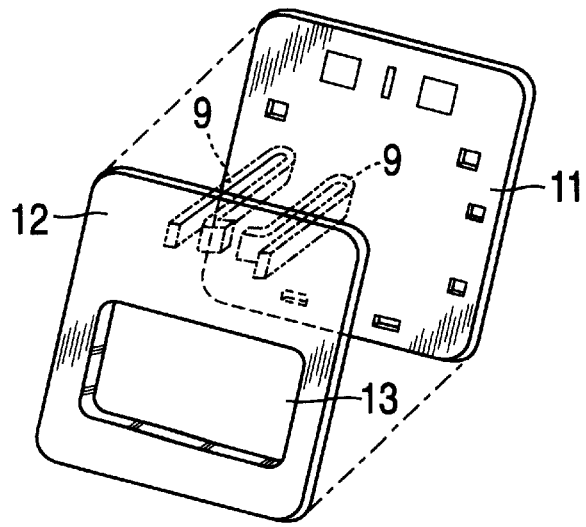
FIG. 4 is a perspective view of a housing for the night light of FIG. 3.
Figure 11:
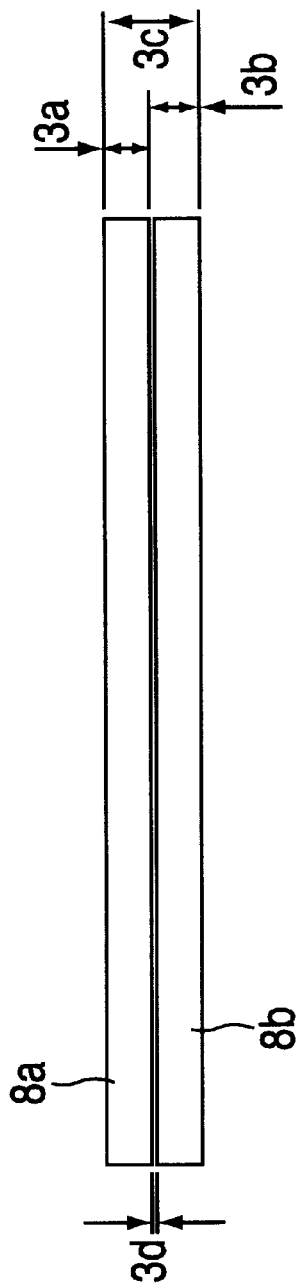
FIGS. 11 and 12 are, respectively, a plan view of an electro-luminescent element suitable for use in connection with the preferred embodiment of the invention, and an end view of the electro-luminescent element shown in FIG. 11.
Figure 12:
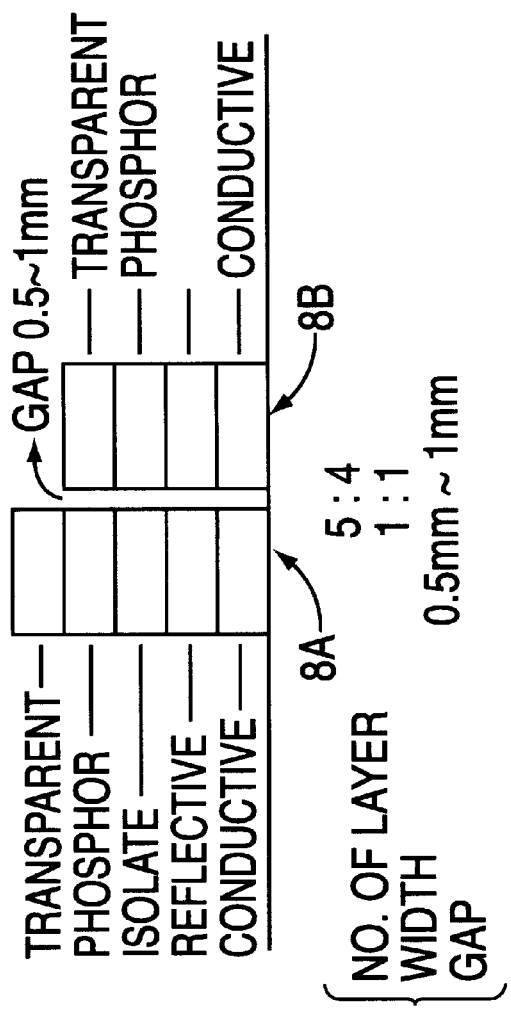

Finally, FIGS. 11 and 12, which are identical to FIGS. 3A and 3B of the parent application, show and electro-luminescent element made up of two parallel EL strip halves 8A and 8B. EL strip half 8A consists of, in order from top to bottom, a transparent conductive layer, a phosphor layer, an isolation layer, a reflective layer, and a conductive layer, while EL strip half 8B consists of, in order from top to bottom, a transparent conductive layer, a phosphor layer, an isolation layer, and a conductive layer. Each of the layers is per se identical to corresponding layers in conventional EL strips, except that the transparent conductive layer does not include an extra-width section of the type discussed in the parent application in connection with the prior art. Unlike the conventional EL strip shown in FIGS. 1A–1D of the parent application, however, electrical connection to the EL strip of the preferred embodiment is accomplished by simply establishing a direct electrical connection with the respective lowermost conductive layers of the two EL strip halves, with one of the conductive layers serving as the low voltage connection and the other as the high voltage connection, and thus this strip is especially suitable for use in connection with the night lights illustrated in FIGS. 4–10.

Having thus described a preferred embodiment of the invention and a number of different variations and modifications of the preferred embodiment, it is anticipated that still further variations and modifications will undoubtedly occur to those skilled in the art upon reading the above description, and it is therefore intended that the invention be interpreted solely in accordance with the appended claims.

I claim:

1. A night light, comprising:

at least one electro-luminescent element having oppositely facing surfaces and electrodes situated on one of said surfaces;

a plug having at least two prongs for connection to a power source;

conductive means having a first surface in contact with said electrodes and a second surface opposite said first surface in contact with said prongs;

a housing in which said electro-luminescent element, prongs, and conductive means are housed;

fixing means for fixing the electro-luminescent element in the housing; and assembly means for assembling said housing in such a manner that, when the housing is assembled, said conductive means is caused to securely contact said electrodes and said prongs to thereby establish an electrical connection between said electrodes and said prongs.

2. A night light as claimed in claim 1, wherein said electro-luminescent element is a thin electro-luminescent panel having correspondingly thin electrodes extending therefrom in contact with said conductive means.

3. A night light as claimed in claim 1, wherein the conductive means is made from a resilient material.

4. A night light as claimed in claim 1, further comprising a frontsheet which forms a stencil and which is positioned between said electro-luminescent element and a person viewing the night light.

5. A night light as claimed in claim 1, wherein the electro-luminescent element having a plurality of phosphor coated areas.

6. A night light as claimed in claim 1, wherein the assembly means is selected from the group consisting of posts, walls, double-sided tape, Velcro™ hook and loop fastener tape, and glue.

7. A night light as claimed in claim 1, wherein the assembly means is selected from the group consisting of ultrasonic sealing, glue, melting, hot welding, screws, and Velcro™ hook and loop fastener tape.

8. A night light as claimed in claim 1, further including decorative elements selected from the group consisting of stencilling, phosphor arrangements, discrete electro-luminescent elements, silk-screening, films, filters, and masking.

9. A night light as claimed in claim 1, further comprising an optical element in the form of a separate member fitted onto a front of said electro-luminescent element.

10. A night light as claimed in claim 1, wherein said fixing means is selected from the group consisting of a wall in the housing, posts, glue, double-sided tape, and indentations or other structural features of the housing.

11. A connector arrangement for an electro-luminescent light element, comprising:

a first housing member which includes means for positioning an electro-luminescent element, means for positioning a pair of conductors, and means for positioning a pair of compressible conductive members relative to both the electro-luminescent element and the pair of conductors; and means for compressing the conductive members against conductive layers of the electro-luminescent element and against the conductors to establish an electrical connection between the conductors and the electro-luminescent element, wherein said conductors are prongs of a night light plug.

* * * * *